(12) United States Patent
Nishimura et al.

(10) Patent No.: US 9,419,211 B2
(45) Date of Patent: Aug. 16, 2016

(54) ETCHING METHOD AND SUBSTRATE PROCESSING APPARATUS

(71) Applicant: Tokyo Electron Limited, Tokyo (JP)

(72) Inventors: Eiichi Nishimura, Miyagi (JP); Masato Kushibiki, Miyagi (JP); Nao Koizumi, Miyagi (JP); Takashi Sone, Miyagi (JP); Fumiko Yamashita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/065,597

(22) Filed: Oct. 29, 2013

(65) Prior Publication Data

US 2014/0120635 A1    May 1, 2014

Related U.S. Application Data

(60) Provisional application No. 61/721,751, filed on Nov. 2, 2012.

(30) Foreign Application Priority Data

Oct. 30, 2012 (JP) ................................ 2012-239486

(51) Int. Cl.
*H01L 21/00* (2006.01)
*H01L 43/12* (2006.01)
*H01J 37/32* (2006.01)

(52) U.S. Cl.
CPC ............ *H01L 43/12* (2013.01); *H01J 37/32091* (2013.01)

(58) Field of Classification Search
CPC ................... H01L 21/3065; H01L 43/12
USPC ........ 438/3, 38, 703, 706, 710; 257/E21.255, 257/E21.256, E23.002, E43.006; 156/345.28
See application file for complete search history.

(56) References Cited

U.S. PATENT DOCUMENTS

2011/0143548 A1* 6/2011 Cheung ................... G03F 7/427
                                                                    438/714
2011/0272380 A1* 11/2011 Jeong et al. ...................... 216/22
2011/0308544 A1* 12/2011 Osada et al. .................... 134/1.1

FOREIGN PATENT DOCUMENTS

JP         2002-230720 A        8/2002

* cited by examiner

*Primary Examiner* — Charles Garber
*Assistant Examiner* — Abdulfattah Mustapha
(74) *Attorney, Agent, or Firm* — Pearne & Gordon LLP

(57) ABSTRACT

A gas for an etching process and a treatment process of a metal stacked film in which an insulating layer is interposed between two layers of magnetic materials can be optimized. An etching method of etching a multilayered film including a metal stacked film in which an insulating layer is interposed between a first magnetic layer and a second magnetic layer includes etching the metal stacked film with plasma generated by supplying a gas containing at least C, O, and H into a processing chamber; and treating the metal stacked film with plasma generated by supplying a gas containing at least a $CF_4$ gas into the processing chamber.

7 Claims, 14 Drawing Sheets

FIG. 2

MRAM MANUFACTURING PROCESS
↓ S1
MANUFACTURE TARGET SUBSTRATE
↓ S2
ETCH UPPER ELECTRODE LAYER AND FIRST MAGNETIC LAYER
↓ S3
FORM PROTECTIVE FILM
↓ S4
ETCH/TREAT METAL STACKED FILM
↓ S5
ETCH SECOND MAGNETIC LAYER AND PINNING LAYER
↓ S6
ETCH LOWER ELECTRODE LAYER
↓
END

FIG. 3

| | mp | Co | Pd | Ru |
|---|---|---|---|---|
| MELTING POINT OF SINGLE SUBSTANCE | | 1478 | 1554.8 | 2333 |
| | Cl | 737 | 679 | ~500 |
| | S | 1117 | – | – |
| | F | 1127 | – | 54~600 |
| | $F_2$ | | 952 | – |
| MELTING POINT OF COMPOUND | O | 1830 | 750 | 25.4 |
| | CO | 60.51 | – | -22~150 |
| | H | – | – | – |
| | C | – | – | – |
| | CH | 173 | – | – |
| | CH*O | ~-30 | 205 | – |

AFTER TREATMENT PROCESS (CF$_4$)

AFTER ETCHING PROCESS

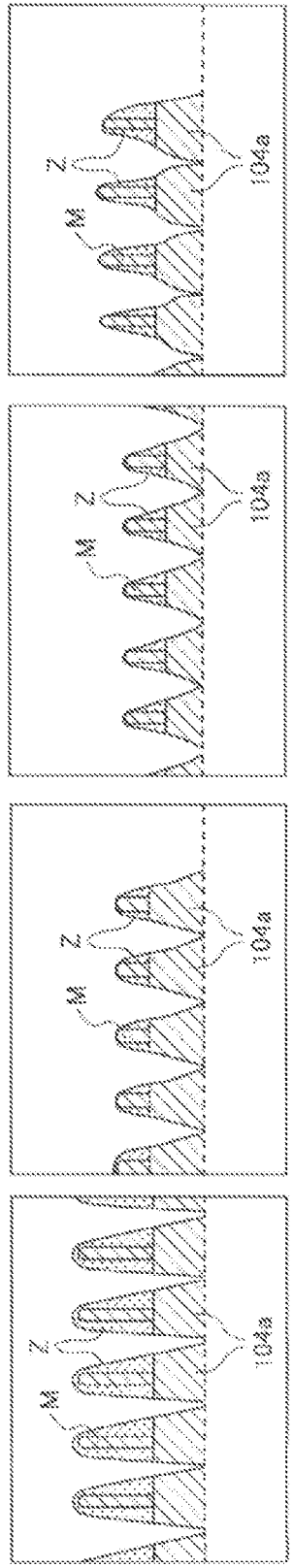

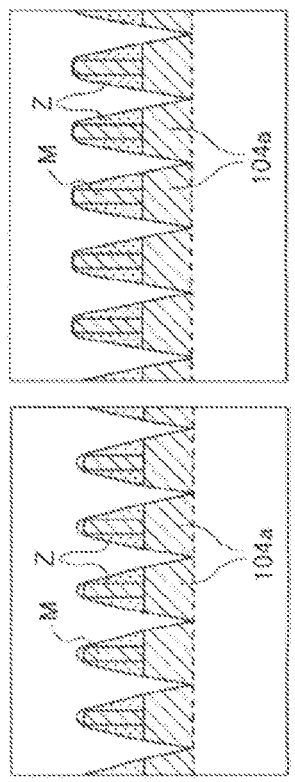
FIG. 10A AFTER TREATMENT PROCESS (CO₂/Ar)
FIG. 10B AFTER TREATMENT PROCESS (H₂/N₂)
FIG. 10C AFTER TREATMENT PROCESS (C₄F₈/Ar)
FIG. 10D AFTER TREATMENT PROCESS (CF₄)

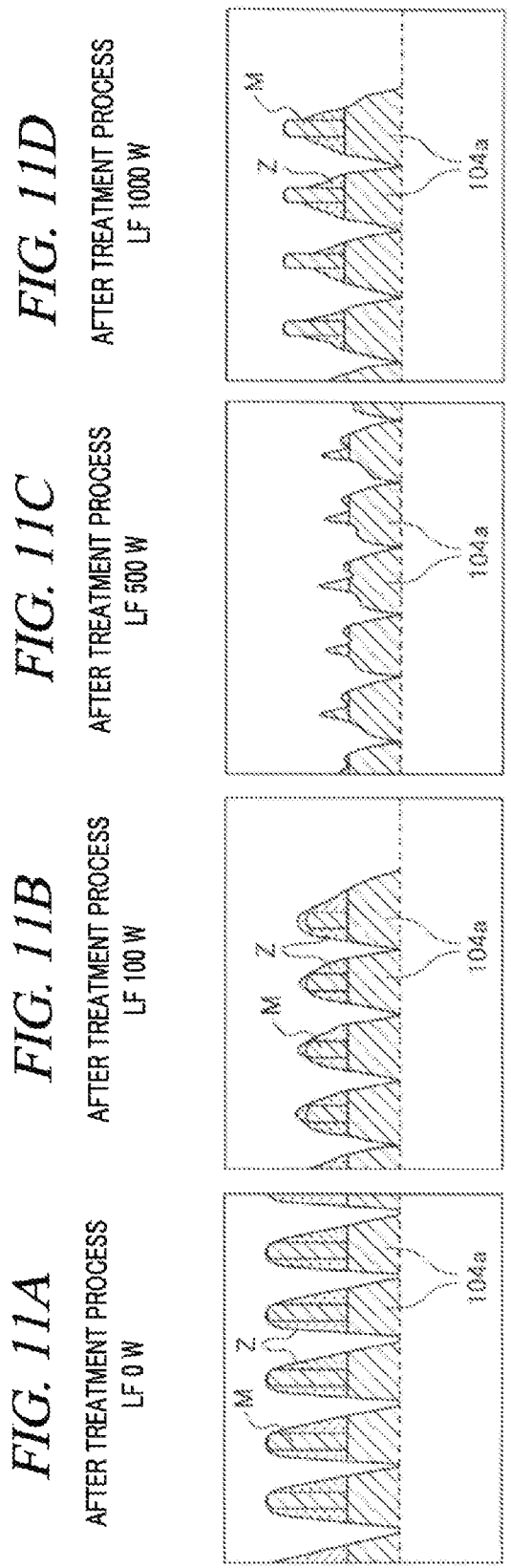

AFTER TREATMENT PROCESS

AFTER TREATMENT PROCESS

ETCHING METHOD AND SUBSTRATE PROCESSING APPARATUS

CROSS-REFERENCE TO RELATED APPLICATION

This application claims the benefit of Japanese Patent Application No. 2012-239486 filed on Oct. 30, 2012, and U.S. Provisional Application Ser. No. 61/721,751 filed on Nov. 2, 2012, the disclosures of which are incorporated herein by reference.

TECHNICAL FIELD

The embodiments described herein pertain generally to an etching method and a substrate processing apparatus.

BACKGROUND

A magnetic random access memory (MRAM; hereinafter, simply referred to as "MRAM device") device uses a magnetic tunnel junction (MTJ) including a metal stacked film in which an insulating layer is interposed between two layers of magnetic materials. The MRAM device is formed of a multilayered film including a metal stacked film containing cobalt (Co) or the like.

A metal stacked film has the boiling point of higher than about 1000° C. Thus, conventionally, a metal stacked film has mainly been etched by sputtering. Recently, there has been suggested a method of dry etching a metal stacked film of a MRAM device. By way of example, in Patent Document 1, there has been suggested a method of dry etching a metal stacked film of a MRAM device by using an etching gas containing a chlorine gas ($Cl_2$) or a fluorine gas ($F_2$).

Patent Document 1: Japanese Patent Laid-open Publication No. 2002-230720

However, if a metal stacked film is dry etched by using an etching gas containing a chlorine gas ($Cl_2$) or a fluorine gas ($F_2$), a reaction product containing chlorine (Cl) or fluorine (F) is generated during the etching process. The reaction product containing chlorine (Cl) or fluorine (F) is difficult to be evaporated and remains within a processing chamber. As a result, the reaction product is deposited on a wall surface of the metal stacked film by etching, so that a shape of a base layer is damaged. Further, since the reaction product containing chlorine (Cl) or fluorine (F) is difficult to be evaporated, it is also difficult to remove the reaction product from the etched surface, and, thus, a target line width (CD: Critical Dimension) cannot be obtained, which makes it difficult to control the etching process.

By way of example, if a metal stacked film contains cobalt (Co), when the metal stacked film is dry etched by using an etching gas containing a chlorine gas ($Cl_2$) or a fluorine gas ($F_2$), a reaction product generated during the etching process contains a reaction product generated from a reaction between cobalt (Co) and chlorine (Cl) or a reaction product generated from a reaction between cobalt (Co) and fluorine (F). Herein, a compound of cobalt (Co) and chlorine (Cl) has the melting point of 737° C., and a compound of cobalt (Co) and fluorine (F) has the melting point of 1127° C. If a compound has a high melting point as such, a reaction product generated during an etching process is difficult to be evaporated and remains within a processing chamber. In order to perform an etching process with high efficiency and to obtain a vertical etching profile, it is important to select an etching gas from which a reaction product having low melting point and boiling point is generated such that the reaction product can be immediately evaporated and exhausted during the etching process.

SUMMARY

In view of the foregoing problems, example embodiments provide a substrate processing apparatus and an etching method capable of performing a good plasma process by optimizing a gas for an etching process and a treatment process of a metal stacked film in which an insulating layer is interposed between two layers of magnetic materials.

In one example, an etching method of etching a multilayered film including a metal stacked film in which an insulating layer is interposed between a first magnetic layer and a second magnetic layer includes etching the metal stacked film with plasma generated by supplying a gas containing at least C, O, and H into a processing chamber; and treating the metal stacked film with plasma generated by supplying a gas containing at least a $CF_4$ gas into the processing chamber.

In another example, a substrate processing apparatus includes a processing chamber; a gas supply source configured to supply a gas into the processing chamber; a mounting table configured to mount thereon a multilayered film including a metal stacked film in which an insulating layer is interposed between a first magnetic layer and a second magnetic layer; a high frequency power supply configured to supply a high frequency power into the processing chamber; and a control unit configured to control a process for the multilayered film. Further, the control unit controls an etching process of etching the metal stacked film with plasma generated from a gas containing at least C, O, and H supplied into the processing chamber by using the high frequency power supplied into the processing chamber; and a treating process of treating the metal stacked film with plasma generated from a gas containing at least a $CF_4$ gas supplied into the processing chamber by using the high frequency power supplied into the processing chamber.

As explained above, a good plasma process can be performed by optimizing a gas for the etching process and the treatment process of the metal stacked film in which the insulating layer is interposed between two layers of magnetic materials. The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 2 is a flow chart showing a manufacturing process of a MRAM device in accordance with the example embodiment;

FIG. 3 provides a table showing melting points of metallic elements and compounds thereof;

FIG. 9A to FIG. 9D show results of a treatment process depending on a gas mixing ratio in accordance with the example embodiment;

FIG. 10A to FIG. 10D show results of a treatment process depending on a kind of gas in accordance with the example embodiment;

FIG. 11A to FIG. 11D show results of a treatment process depending on a high frequency bias power in accordance with the example embodiment;

DETAILED DESCRIPTION

Figure 1:
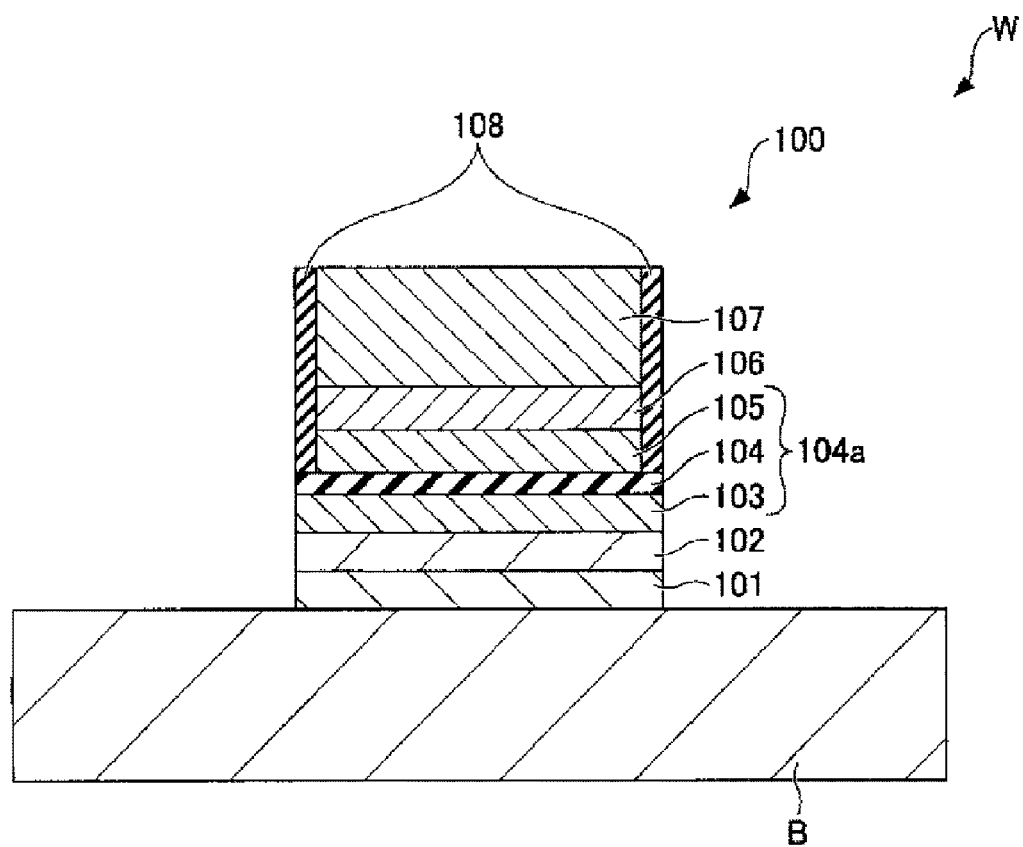
FIG. 1 shows an example of a MRAM device manufactured by an etching method in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example. Still, the examples described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein. Although illustrated as discrete components, various components may be divided into additional components, combined into fewer components, or eliminated altogether while being contemplated within the scope of the disclosed subject matter. It will be understood by those skilled in the art that each function and/or operation of the components may be implemented, individually and/or collectively, by a wide range of hardware, software, firmware, or virtually any combination thereof.

[MRAM Device]

A MRAM device will be explained first. A MRAM device is formed of a multilayered film that includes a metal stacked film containing Co, Fe, B, Pd, Pt, Mn, Ir, Ru, Mg, Ti, W, or the like. FIG. 1 shows an example of a MRAM device 100 manufactured by an etching method in accordance with an example embodiment. The MRAM device 100 shown in FIG. 1 is provided on a substrate B and includes a lower electrode layer 101, a pinning layer 102, a second magnetic layer 103, an insulating layer 104, a first magnetic layer 105, an upper electrode layer 106, and a mask 107 stacked in sequence from the bottom. A protective film 108 is formed at side walls of the first magnetic layer 105, the upper electrode layer 106, and the mask 107. Hereinafter, a stacked film in which the insulating layer 104 is interposed between the first magnetic layer 105 and the second magnetic layer 103 will also be referred to as a metal stacked film 104a.

The lower electrode layer 101 is formed on substrate B as an electrode member having electrical conductivity. A thickness of the lower electrode layer 101 is, for example, about 5 nm. The pinning layer 102 is provided between the lower electrode layer 101 and the second magnetic layer 103. The pinning layer 102 is configured to fix or pin a magnetization direction of the lower electrode layer 101 by a pinning effect by an anti-ferromagnetic material. The pinning layer 102 is made of an anti-ferromagnetic material such as IrMn (iridium manganese), PtMn (platinum manganese), and the like and has a thickness of, for example, about 7 nm.

The second magnetic layer 103 is a ferromagnetic material-containing layer formed on the pinning layer 102. The second magnetic layer 103 functions as a so-called "pinned layer" in which a magnetization direction is maintained uniformly without the influence of an external magnetic field by the pinning effect of the pinning layer 102. The second magnetic layer 103 is made of CoFeB and has a thickness of, for example, about 2.5 nm.

The insulating layer 104 is interposed between the second magnetic layer 103 and the first magnetic layer 105 and forms a magnetic tunnel junction (MTJ). In the magnetic tunnel junction (MTJ), the insulating layer 104 is interposed between the second magnetic layer 103 and the first magnetic layer 105, so that a tunnel magnetoresistance (TMR) is generated between the second magnetic layer 103 and the first magnetic layer 105. That is, between the second magnetic layer 103 and the first magnetic layer 105, an electric resistance is caused by a relative relationship (parallel or anti-parallel relationship) between a magnetization direction of the second magnetic layer 103 and a magnetization direction of the first magnetic layer 105. The insulating layer 104 is made of $Al_2O_3$ or MgO and has a thickness of, for example, about 1.3 nm.

The first magnetic layer 105 is a ferromagnetic material-containing layer formed on the insulating layer 104. The first magnetic layer 105 functions as a so-called "free layer" in which a magnetization direction can be changed in response to an external magnetic field as magnetic information. The first magnetic layer 105 is made of CoFeB and has a thickness of, for example, about 2.5 nm.

The upper electrode layer 106 is formed on the first magnetic layer 105 as an electrode member having electrical conductivity. A thickness of the upper electrode layer 106 is, for example, about 5 nm. The mask 107 is formed on the upper electrode layer 106. The mask 107 is formed in a shape along a plane shape of the MRAM device 100. The mask 107 is made of, for example, Ta, TiN, Si, W, Ti, and the like and has a thickness of, for example, about 50 nm.

[MRAM Device Manufacturing Process]

Hereinafter, a manufacturing process of the MRAM device having the above-described configuration will be explained with reference to FIG. 2. FIG. 2 is a flow chart showing a manufacturing process of the MRAM device. One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Figure 5A:
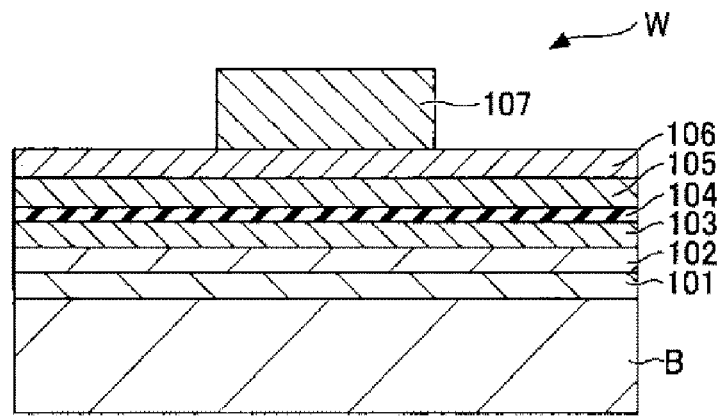
FIG. 5A to FIG. 5C show a manufacturing process of a MRAM device by an etching method in accordance with the example embodiment.

When a MRAM manufacturing process is started, at block S1 (manufacture target substrate), a target substrate W formed of a multilayered film is manufactured by a film forming apparatus. Then, the target substrate W is mounted on an electrostatic chuck of an etching apparatus. FIG. 5A shows an example of the target substrate W formed during the manufacturing process of the MRAM device 100. In the target substrate W, multilayered materials composed of the lower electrode layer 101, the pinning layer 102, the second magnetic layer 103, the insulating layer 104, the first magnetic layer 105, and the upper electrode layer 106 are stacked on the substrate B. On the upper electrode layer 106, the mask 107 having a preset plane shape is provided. Hereinafter, there will be explained a MRAM device manufacturing process using an etching method in accordance with an example with reference to the target substrate W depicted in FIG. 5A.

Figure 5B:
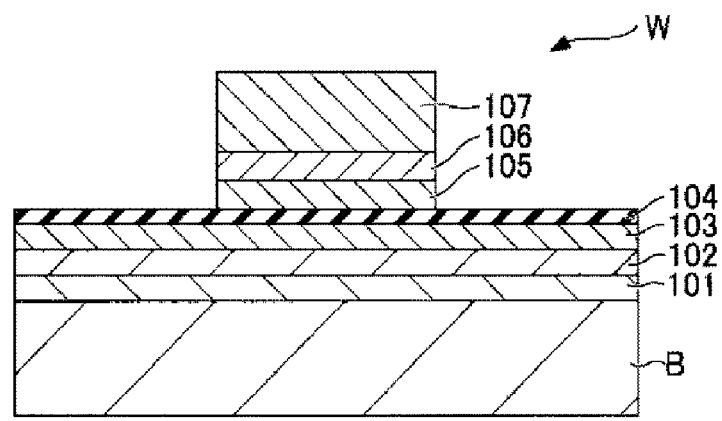

At block S2 (etch upper electrode layer and first magnetic layer), the upper electrode layer 106 is firstly etched. An etching gas used herein may include, for example, $Cl_2$, $CH_4$, He, $N_2$, Ar, and the like. By way of example, a processing gas containing chlorine ($Cl_2$) is supplied and plasma is generated to etch the target substrate W. The processing gas may include an inert gas such as He, $N_2$, Ar, or the like and $H_2$. Then, at block S2, a part of the first magnetic layer 105 that is not covered with the mask 107 is etched with the processing gas. Since a gas capable of acquiring sufficient selectivity of the first magnetic layer 105 with respect to the insulating layer 104 is employed, the insulating layer 104 is not etched. Therefore, at block S2, as depicted in FIG. 5B, the etching process is ended on a surface of the insulating layer 104.

Figure 5C:
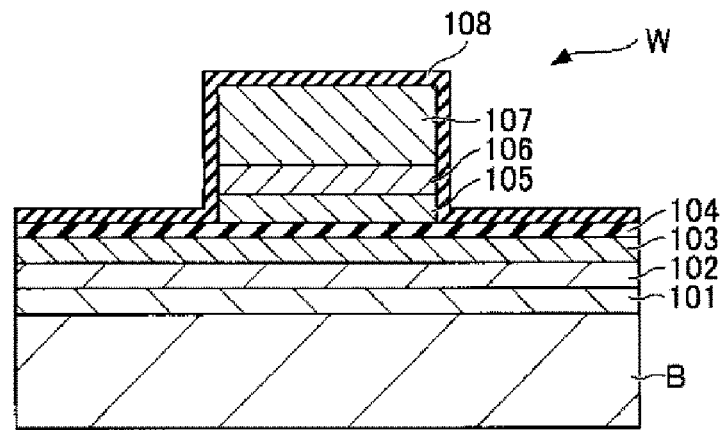

In the etching method in accordance with the example embodiment, at block S3 (form protective film), the target substrate W is transferred into a film forming apparatus (for example, a RLSA apparatus or a CVD apparatus), and as depicted in FIG. 5C, a surface of the target substrate W is covered with the protective film 108 formed of an insulating material. By way of example, SiN or $SiO_2$ is used as the protective film 108. Then, the target substrate W is returned back to the etching apparatus, and an etching process is performed such that the protective film 108 remains at side walls of the first magnetic layer 105, the upper electrode layer 106, and the mask 107. That is, at block S4 (etch/treat metal stacked film), the insulating layer 104 (metal stacked film 104a) is etched and treated.

Figure 4:
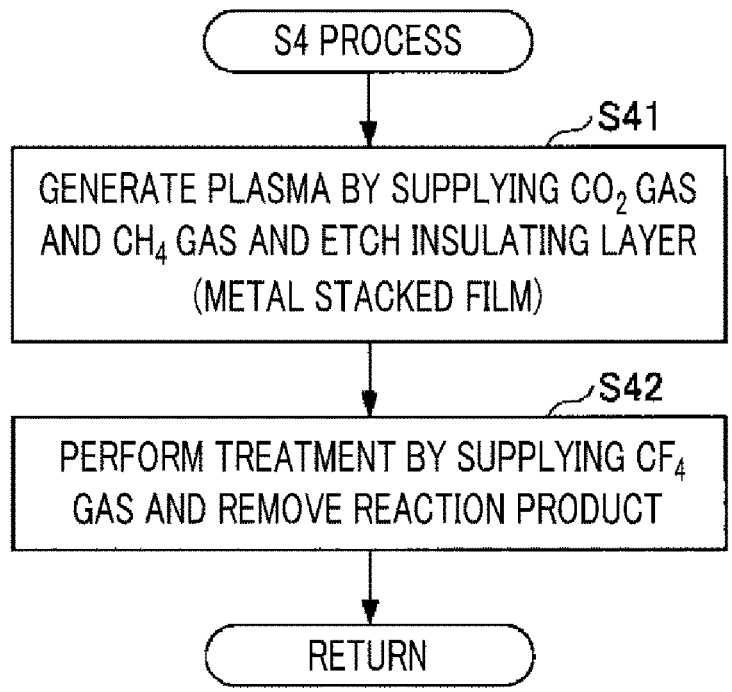
FIG. 4 is a flow chart showing an etching process and a treatment process in accordance with the example embodiment.
Figure 6A:
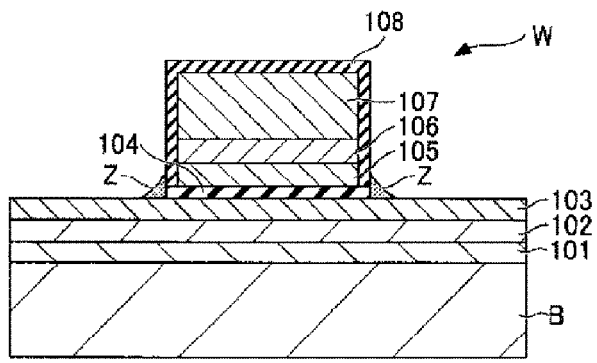
FIG. 6A to FIG. 6D show the (subsequent) manufacturing process of the MRAM device by the etching method in accordance with the example embodiment.

To be specific, at block S41 (generate plasma by supplying $CO_2$ gas and $CH_4$ gas and etch insulating layer (metal stacked film)) called from block S4 in FIG. 4, plasma is generated by supplying a $CO_2$ gas and a $CH_4$ gas into a processing chamber and the insulating layer 104 (metal stacked film 104a) is etched with the generated plasma (etching process). Thus, as depicted in FIG. 6A, the insulating layer 104 (metal stacked film 104a) is etched but a reaction product Z generated during the etching process is deposited.

The reaction product Z may contain metals contained in the mask 107, the protective film 108, and the insulating layer 104, oxides of these metals, compounds containing C or H, or the like. The reaction product Z, as depicted in FIG. 6A, adheres to side walls of the insulating layer 104, the first magnetic layer 105, the upper electrode layer 106, and the mask 107. The reaction product Z deposited on etched surfaces of the metal stacked film impedes formation of a vertical etching profile. Further, since the reaction product Z contains a conductive material, if the reaction product Z is left as it is, a leak current may be generated at the MRAM device 100 through the reaction product Z.

Figure 6B:
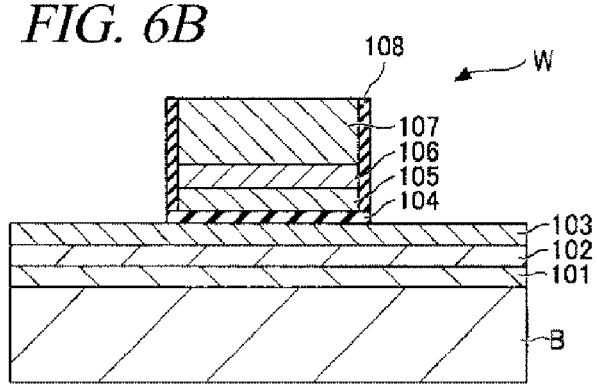

Therefore, at block S42 (perform treatment by supplying $CF_4$ gas and remove reaction product), plasma is generated by supplying a $CF_4$ gas into the processing chamber and the insulating layer 104 (metal stacked film 104a) is treated with the generated plasma (treatment process). As a result, the reaction product Z is removed (FIG. 6B). Further, in the present example embodiment, the etching process and the treatment process are carried out in the same etching apparatus (substrate processing apparatus). A configuration of the substrate processing apparatus will be described later.

Figure 6C:
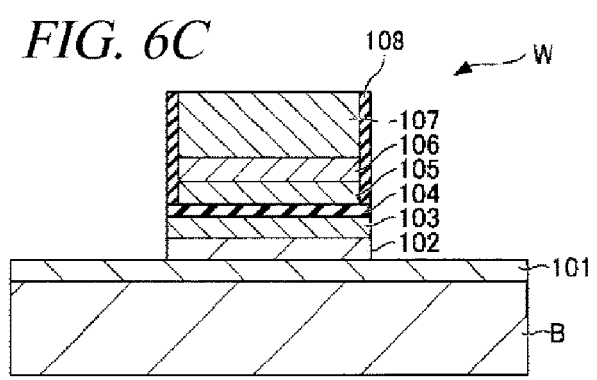

Then, returning to FIG. 2, at block S5 (etch second magnetic layer and pinning layer), the second magnetic layer 103 and the pinning layer 102 are etched with a gas including a $CH_4$ gas (FIG. 6C). The processing gas may include an inert gas such as He, $N_2$, Ar, or a gas containing a carbonyl group, $H_2$, or the like except methane. At block S5, parts of the second magnetic layer 103 and the pinning layer 102 that are not covered with the mask 107 and the protective film 108 are etched. Thus, each of the pinning layer 102, the second magnetic layer 103, and the insulating layer 104 has a width greater than that of the first magnetic layer 105, the upper electrode layer 106, and the mask 107 by a width of the protective film 108.

Figure 6D:
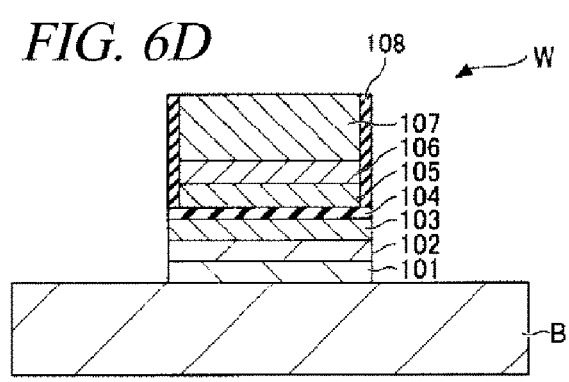

In the etching method in accordance with the example embodiment, at block S6 (etch lower electrode layer), a processing gas is supplied and plasma is generated to etch the lower electrode layer 101 (FIG. 6D). The processing gas may include an inert gas such as He, $N_2$, Ar, or a gas containing a carbonyl group, $CH_4$, $H_2$, or the like. At block S6, a part of the lower electrode layer 101 that is not covered with the mask 107 and the protective film 108 is etched. Thus, the lower electrode layer 101 has a width greater than the width of the first magnetic layer 105, the upper electrode layer 106, and the mask 107 by the width of the protective film 108.

Through the whole processes described above, the MRAM device 100 having a multilayered film structure is formed on the target substrate W.

[Modification Example]

Further, during the treatment process of the present example embodiment, plasma is generated and a plasma process is carried out in the same manner as the etching process. During the etching process, a gas containing at least C, O, and H is used to generate the plasma. A gas supplied during the etching process may contain other gases in addition to the gas containing at least C, O, and H. The other gases may include a $CF_4$ gas.

During the treatment process, plasma is generated by using a gas containing at least a $CF_4$ gas. A gas supplied during the treatment process may be a mixture gas including other gases in addition to the $CF_4$ gas.

Figure 7:
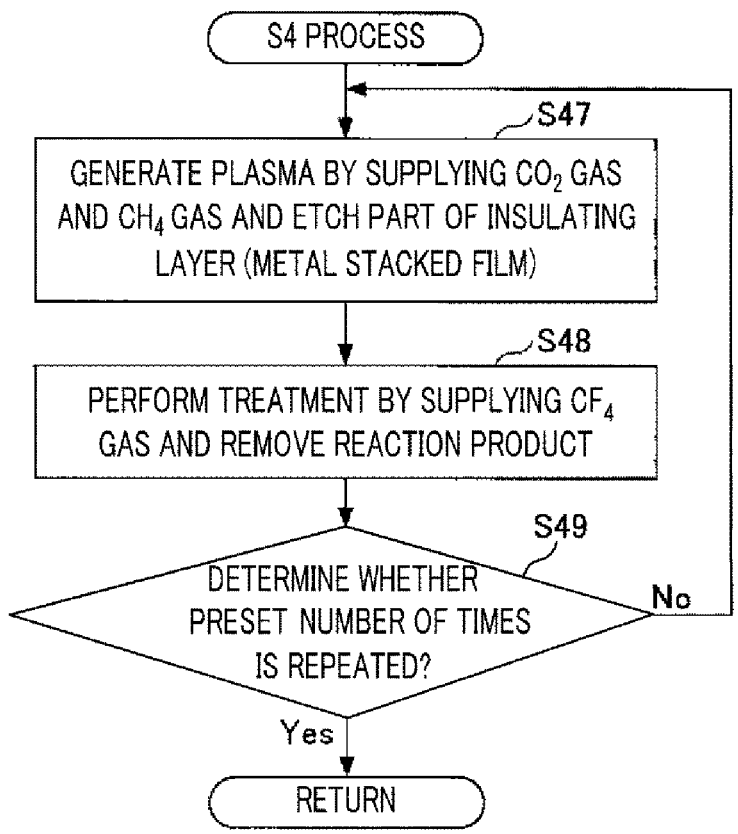
FIG. 7 is a flow chart showing an etching process and a treatment process in accordance with a modification example of the example embodiment.

In the present example embodiment, the treatment process is carried out after the etching process. However, in the present example embodiment, the treatment process may be carried out during the etching process. Further, the etching process and the treatment process may be repeated a preset number of times. By way of example, in a modification example of the etching method of the present example embodiment, as depicted in FIG. 7, the etching process and the treatment process are alternately repeated. In the present modification example, at block S47 (generate plasma by supplying $CO_2$ gas and $CH_4$ gas and etch part of insulating layer (metal stacked film)), plasma is generated by supplying a $CO_2$ gas and a $CH_4$ gas into the processing chamber and the insulating layer 104 (metal stacked film 104a) is etched with the generated plasma. Then, during the treatment process at block S48 (perform treatment by supplying $CF_4$ gas and remove reaction product), the reaction product Z is removed with a $CF_4$ gas.

Thereafter, at block S49 (determine whether preset number of times is repeated), it is determined whether block S47 and block S48 are repeated a preset number of times. If not repeated, the process returns to block S47, and block S47 to block S49 are repeated to the preset number of times. Here, the preset number of times may be one or more times.

As described above, by repeating the etching process and the treatment process a preset number of times, the reaction product Z generated during the etching process can be removed during the treatment process, and then, a subsequent etching process can be performed. Therefore, it is possible to perform a subsequent etching process while removing the reaction product Z that deteriorates controllability of the etching process. As a result, an etching rate can be increased. Further, since the reaction product Z deposited during the etching process is removed each time during the treatment process and a side wall of the mask M can be maintained as being more vertical, a more vertical etching profile can be formed.

[Selection of Gas]

Hereinafter, there will be explained selection of a gas used for the etching process and a gas used for the treatment process. By way of example, if the metal stacked film 104a contains cobalt (Co), when a dry etching process is performed by using an etching gas containing a chlorine gas ($Cl_2$) or a fluorine gas ($F_2$), the reaction product Z generated during the etching process contains a reaction product generated from a reaction between cobalt (Co) and chlorine (Cl) or a reaction product generated from a reaction between cobalt (Co) and fluorine (F).

Herein, the explanation will be provided with reference to a table of FIG. 3 showing melting points of metallic elements and compounds thereof. The source of FIG. 3 is [HANDBOOK OF CHEMISTRY and PHYSICS] W. M. Haynes Editor-in-Chief 92ND EDITION 2011-2012, and Gas-Phase Growth LTD.

In FIG. 3, a melting point of a compound of cobalt (Co) and chlorine (Cl) is 737° C. and a melting point of a compound of cobalt (Co) and fluorine (F) is 1127° C. If a compound has a high melting point as such, the compound is difficult to be evaporated and remains within a processing chamber. In order to perform an etching process with high efficiency and to obtain a vertical etching profile, it is important to select an etching gas from which the reaction product Z having low melting point and boiling point is generated such that the reaction product Z can be immediately evaporated and exhausted during the etching process.

Therefore, the inventors considered selecting a gas capable of readily removing the reaction product Z, which is generated when the insulating layer (metal stacked film 104a) interposed between two magnetic layers is etched with a gas containing at least C, O, and H, during the treatment process. To be specific, the inventors considered using a $CF_4$ gas or a gas containing a $CF_4$ gas for removing the reaction product Z during the treatment process after the insulating layer is dry etched. If a $CF_4$ gas is used for the treatment process, cobalt (Co) and carbon monoxide (CO) are bonded to each other, so that a compound containing a carbonyl group is generated. It is known that a compound containing a carbonyl group has low melting point and boiling point, and thus, can be easily sublimated. By way of example, referring to FIG. 3, the melting point of the compound of cobalt (Co) and carbon monoxide (CO) is as low as 60.51° C. and can be easily sublimated.

In view of the foregoing, the inventors wondered if the reaction product Z deposited during the etching process is sublimated by supplying a $CF_4$ gas during the treatment process. Therefore, the inventors actually conducted an experiment to obtain the optimum selection of a gas based on such knowledge.

EXPERIMENT

Hereinafter, there will be explained results of experiments conducted to select a gas used for a treatment process after an etching process using a $CO_2$ gas and a $CH_4$ gas, and to optimize other processing conditions. The results are as shown in FIG. 8A to FIG. 12B.

Experiment Result 1

Figure 8B:
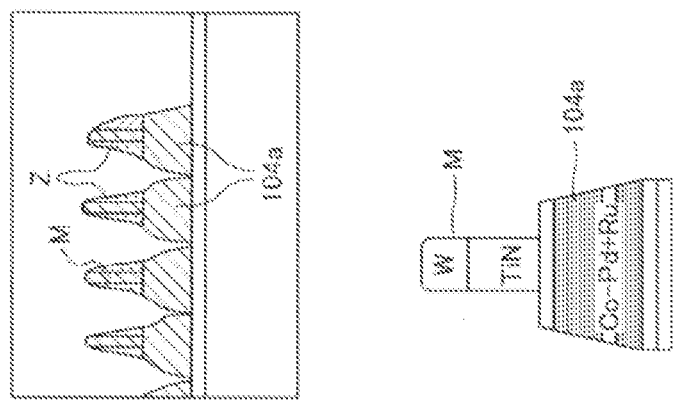
FIG. 8A and FIG. 8B show results of an etching process and a treatment process in accordance with the example embodiment.
Figure 8A:
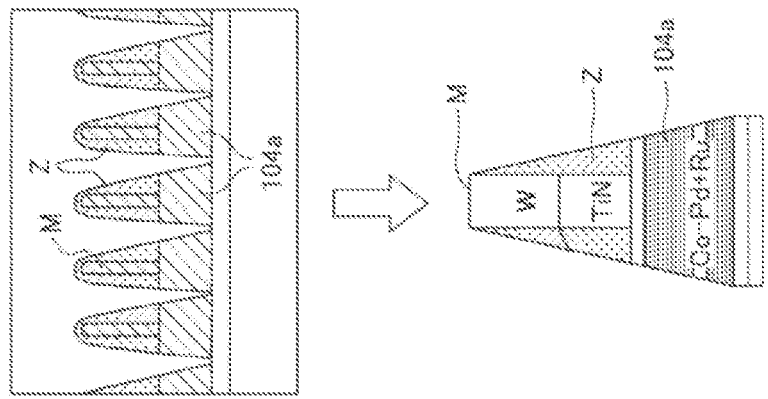

FIG. 8A is a cross-sectional SEM image after the metal stacked film 104a is etched by using a $CO_2$ gas and a $CH_4$ gas with tungsten (W) and titanium nitride (TiN) as the mask M and shows an example of a metal stacked film after an etching process. Herein, as the metal stacked film 104a, a film containing cobalt (Co) and palladium (Pd) is used. In FIG. 8A, the reaction product Z is deposited on an etched surface of the metal stacked film 104a.

FIG. 8B is a cross-sectional SEM image after the metal stacked film 104a is treated by using a $CF_4$ gas to remove the reaction product Z shown in FIG. 8A and shows an example of a metal stacked film after the treatment process. In the drawings, the metal stacked film 104a and the reaction product Z are illustrated as being separated. However, since the reaction product Z may contain metals contained in the mask 107, the protective film 108, and the insulating layer 104, oxides of these metals, and compounds containing C or H, the reaction product Z may be included in the metal stacked film 104a.

In this case, as processing conditions of the treatment process, a pressure is about 5 mT (about 0.667 Pa), high frequency powers to be applied to the upper electrode and the lower electrode are 800 W and 1500 W, respectively, and a processing time is 30 seconds. As a result, as depicted in FIG. 8B, the reaction product Z is removed by an action of the $CF_4$ gas overall. From the above result, it is considered that the reaction product Z, which is deposited when the metal stacked film 104a is etched by using a $CO_2$ gas and a $CH_4$ gas, is changed into a bonding state, in which the reaction product Z can be easily evaporated, and sublimated by using a $CF_4$ gas during the treatment process.

Experiment Result 2

Hereinafter, there will be explained a case where a gas for a treatment process further contains a rare gas in addition to a $CF_4$ gas with reference to FIG. 9A to FIG. 9D. In the present experiment, an Ar gas is used as a rare gas. In this case, as processing conditions of the treatment process, a pressure is in a range of from about 5 mT to about 10 mT (about 0.667 Pa to about 1.33 Pa), high frequency powers to be applied to the upper electrode and the lower electrode are about 800 W and about 1000 W to about 1500 W, respectively, and a processing time is 60 seconds.

FIG. 9A shows the same image as FIG. 8A. FIG. 9B and FIG. 9C show states after the treatment process using a mixture gas of a $CF_4$ gas and an Ar gas. FIG. 9B shows a result of an experiment where a mixture gas having a flow rate ratio of the $CF_4$ gas to the Ar gas of 1:4 is used, and FIG. 9C shows a result of an experiment where a mixture gas having a flow rate ratio of the $CF_4$ gas to the Ar gas of 1:2 is used. FIG. 9D shows a result of an experiment where only the $CF_4$ gas is used (without addition of the Ar gas). FIG. 9D shows the same image as FIG. 8B.

Referring to FIG. 9B to FIG. 9D, it can be found out that when only the $CF_4$ gas is used as depicted in FIG. 9D, the reaction product Z can be removed most efficiently. When the mixture gas of the $CF_4$ gas and the Ar gas is used as depicted in FIG. 9B and FIG. 9C, the reaction product Z can also be removed. Further, when the $CF_4$ gas (single gas) is used, the reaction product Z can be removed chemically, so that the mask M is less reduced. In this regard, if the Ar gas is added, since the Ar gas physically attacks the metal stacked film 104a containing the reaction product Z, the mask M is greatly reduced. Further, when the Ar gas is added, since the Ar gas attacks the metal stacked film 104a in an inclined direction corresponding to the taper-shaped mask M, an etching profile is difficult to be vertical but easy to be tapered. Thus, it can be found out that a single gas of the $CF_4$ gas is more suitable for a gas for the treatment process as compared with the mixture gas in which the Ar gas is added to the $CF_4$ gas. However, the mixture gas of the $CF_4$ gas and the Ar gas can also be used for the treatment process.

Experiment Result 3

Hereinafter, there will be explained experimental results according to a kind of gas for a treatment process with reference to FIG. 10A to FIG. 10D. In the present experiment, a treatment process is performed by using various kinds of gases in a state after the etching process as depicted in FIG. 8A. In this case, as processing conditions of the treatment process, a pressure is in a range of from about 5 mT to about 10 mT (about 0.667 Pa to about 1.33 Pa), high frequency powers to be applied to the upper electrode and the lower electrode are about 800 W and about 1000 W to about 1500 W, respectively, and a processing time is 60 seconds.

FIG. 10A shows a result of an experiment where a mixture gas of a $CO_2$ gas and an Ar gas is used, FIG. 10B shows a result of an experiment where a mixture gas of a $H_2$ gas and a $N_2$ gas is used, FIG. 10C shows a result of an experiment where a $C_4F_6$ gas and an Ar gas are used, and FIG. 10D shows a result of an experiment where only a $CF_4$ gas is used. FIG. 10D shows the same image as FIG. 8B and FIG. 9D.

Referring to FIG. 10A to FIG. 10D, it can be found out that when only the $CF_4$ gas (single gas) is used as depicted in FIG. 10D, the reaction product Z can be removed most efficiently. It can be seen that during the treatment process as depicted in FIG. 10A to FIG. 10C, the reaction product Z does not reach a state where it is sublimated and removed as shown in the treatment process of FIG. 10D. In particular, during the treatment process as depicted in FIG. 10C, the $C_4F_6$ gas is used. The $C_4F_6$ gas has a higher content ratio of C with respect to F than the $CF_4$ gas used for the treatment process depicted in FIG. 10D. As a result, it is assumed that in the treatment process depicted in FIG. 10C, C is excessively provided to cause generation of the reaction product. In this regard, although not illustrated in FIG. 10A to FIG. 10D, it may be considered using a $NF_3$ gas for the treatment process. However, since the $NF_3$ gas does not contain C, the mask M is also etched and removed. Therefore, it can be seen that during the treatment process, C needs to be contained to generate a deposit (reaction product) to a certain extent. From the above result, it can be found out that it possible to remove the reaction product Z most efficiently by using the $CF_4$ gas (single gas), and even if the mixture gas of the $CF_4$ gas and the Ar gas is used, the reaction product Z can be removed but an effect thereof is lower than a case where only a single gas of the $CF_4$ gas is used. Further, it can be found out that if the treatment process is performed by using another gas instead of using the $CF_4$ gas, the reaction product Z cannot be removed.

Experiment Result 4

Hereinafter, there will be explained experimental results according to a high frequency bias power during a treatment process with reference to FIG. 11A to FIG. 11D. In the present experiment, a treatment process is performed by using a $CF_4$ gas with variable high frequency bias power. In this case, as processing conditions of the treatment process, a pressure is in a range of from about 5 mT to about 10 mT (about 0.667 Pa to about 1.33 Pa), high frequency powers and a processing time are as follows.

FIG. 11A shows a result of an experiment where a high frequency bias power is not applied; FIG. 11B shows a result of an experiment where a high frequency bias power of about 100 W is applied; FIG. 11C shows a result of an experiment where a high frequency bias power of about 500 W is applied; and FIG. 11D shows a result of an experiment where a high frequency bias power of about 1000 W is applied. Further, a high frequency power for generating plasma is about 800 W in all of the experiments. Furthermore, the treatment process is performed for 60 seconds as depicted in FIG. 11A to FIG. 11C, but the treatment process is performed for 20 seconds as depicted FIG. 11D.

As a result, it can be found out that when the high frequency bias power of about 1000 W is supplied from a high frequency power supply, the reaction product Z is further removed as compared with a case where the high frequency bias powers of 0 W, about 100 W, and about 500 W are supplied as depicted in FIG. 11A to FIG. 11C. During the treatment process of FIG. 8B, a high frequency bias power of about 1500 W is supplied and a good result can also be obtained. Thus, it can be found out that it is desirable to apply a high frequency bias power of about 1000 W or more during the treatment process.

Experiment Result 5

Finally, there will be explained experimental results according to a pressure of a treatment process with reference to FIG. 12A and FIG. 12B. In the present experiment, a treatment process is performed by using a $CF_4$ gas with variable pressure in the processing chamber. In this case, as processing conditions of the treatment process, high frequency powers to be applied to the upper electrode and the lower electrode are about 800 W and about 1500 W, respectively, and a processing time is 10 seconds.

Figure 12A:
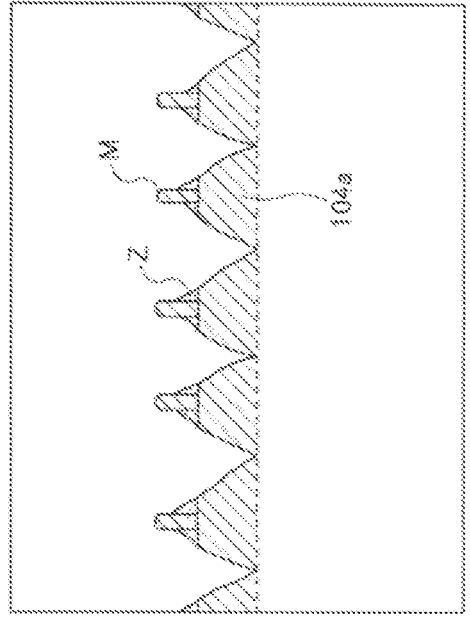
FIG. 12A and FIG. 12B show results of a treatment process depending on a pressure in accordance with the example embodiment.
Figure 12B:
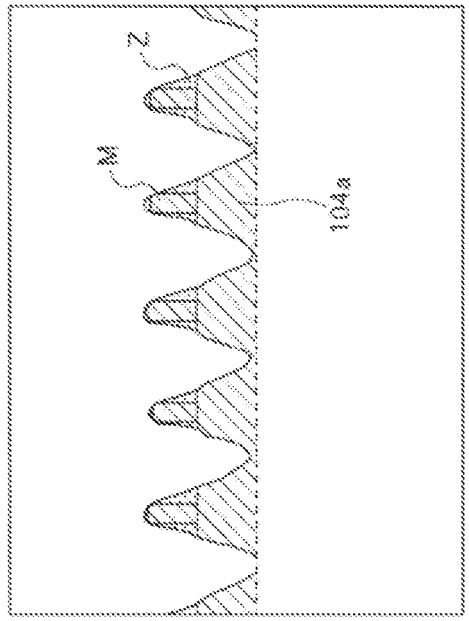

FIG. 12A shows a result of an experiment where a pressure is about 10 mT (about 1.33 Pa) and FIG. 12B shows a result of an experiment where a pressure is about 30 mT (about 4.00 Pa). Referring to FIG. 12A and FIG. 12B, if a pressure is high as shown in FIG. 12B, it is difficult to perform anisotropic etching as compared with a case where a pressure is low as shown in FIG. 12A, but it is possible to perform isotropic etching. As a result, an etching profile is formed in a tapered shape with a lack of verticality. From the above result, it can be seen that it is possible to obtain a better result at a lower pressure during the treatment process.

[Consideration]

From the above experiment results, it is proved that the reaction product Z generated during the etching process in accordance with the present example embodiment can be removed by using a $CF_4$ gas or a mixture gas of a $CF_4$ gas and an Ar gas during the treatment process. This will be taken into consideration as follows.

As described above, if a $CF_4$ gas is used for the treatment process, cobalt (Co) and carbon monoxide (CO) are bonded to each other, so that a compound containing a carbonyl group is formed. By way of example, as shown in box CLa of FIG. 13, it is assumed that cobalt (Co) is surrounded by and bonded to carbon monoxides (CO) and carbon (C) to form a cluster. It is known that a compound containing a carbonyl group has low melting point and boiling point, and thus, can be easily sublimated. By way of example, referring to FIG. 3, the melting point of the compound of cobalt (Co) and carbon monoxide (CO) is as low as 60.51° C.

As described above, cobalt (Co) forms a carbonyl group, whereas palladium (Pd) does not form a carbonyl group. Palladium (Pd) is difficult to be bonded to carbon monoxide (CO) or carbon (C), and has a property of easily absorbing water. That is, palladium (Pd) can be easily bonded to hydrogen (H). Therefore, as shown in box CLb of FIG. 13, palladium (Pd) is surrounded by and bonded to multiple hydrogen (H) to form a cluster. Further, by way of example, between the cobalt (Co) and the palladium (Pd), the palladium (Pd), the hydrogen (H), the carbon monoxide (CO), and the cobalt (Co) are bonded in sequence.

Figure 13:
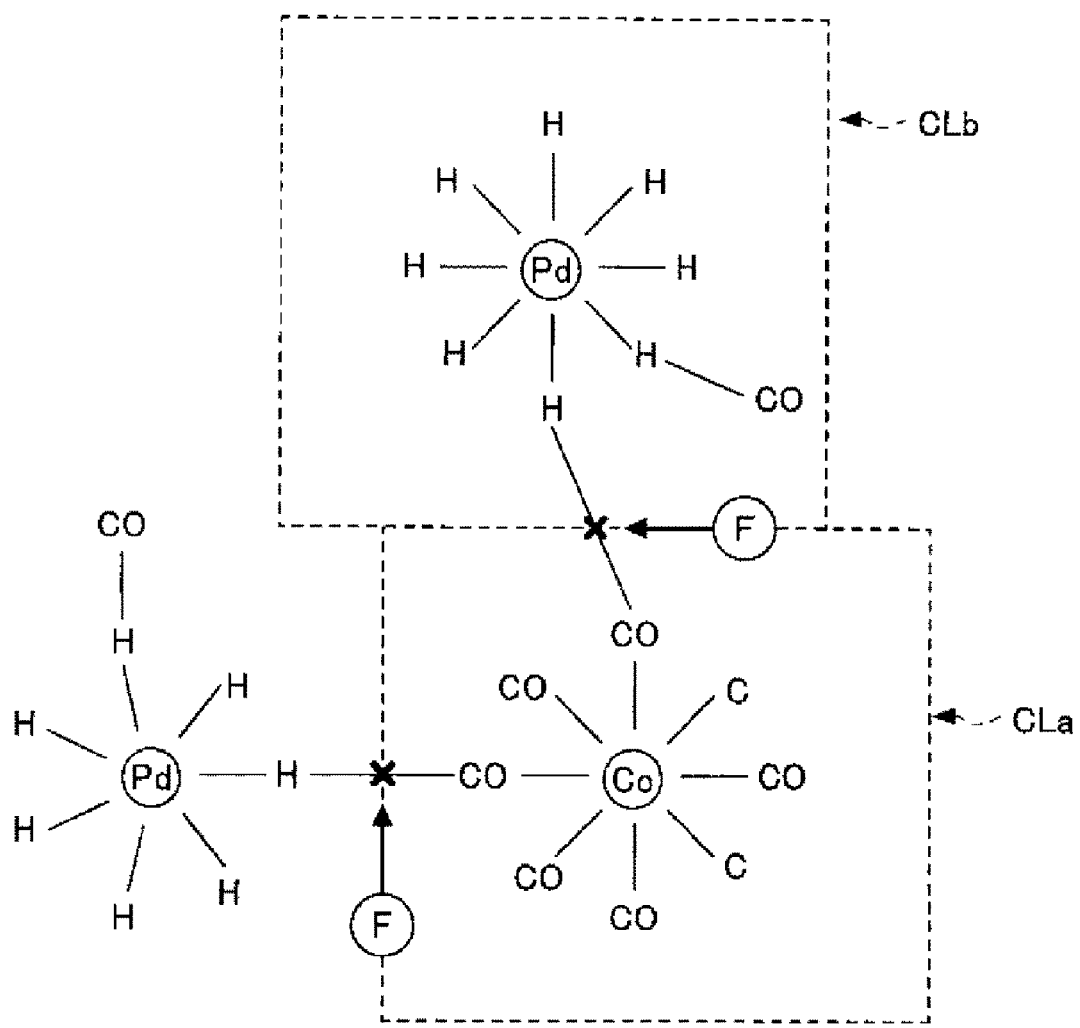
FIG. 13 is a diagram for explaining removal of a reaction product during a treatment process in accordance with the example embodiment.

Regarding the reaction product Z in such a state, plasma of the $CF_4$ gas is generated during the treatment process and fluorine (F) contained in the plasma is bonded to the hydrogen (H). As a result, a bond between the hydrogen (H) and the carbon monoxide (CO) is broken. If the bond therebetween is broken, the compound having a carbonyl group as shown in box CLa of FIG. 13 is sublimated. Further, the compound having a cluster structure with the palladium (Pd) as the center thereof as shown in box CLb of FIG. 13 is also sublimated. This will be explained. By way of example, in the cluster structure with the palladium (Pd) as the center thereof, the hydrogen (H) bonded to the palladium (Pd) also has a part bonded to the carbon monoxide (CO) (i.e., some bonds between the hydrogen (H) and the carbon monoxide (CO) are not broken by the fluorine (F)). In this case, referring to FIG. 3, the melting point of the compound of the palladium (Pd) and CH*O is as low as 205° C. Therefore, the compound having the cluster structure with the palladium (Pd) as the center thereof is in a state where it can be easily sublimated. In view of the foregoing, it is important to use a $CF_4$ gas for the treatment process.

The etching method in accordance with the present example embodiment has been explained above. Hereinafter, a substrate processing system and a substrate processing apparatus of manufacturing the MRAM device 100 by using the etching method in accordance with the present example embodiment will be explained.

[Substrate Processing System]

Figure 14:
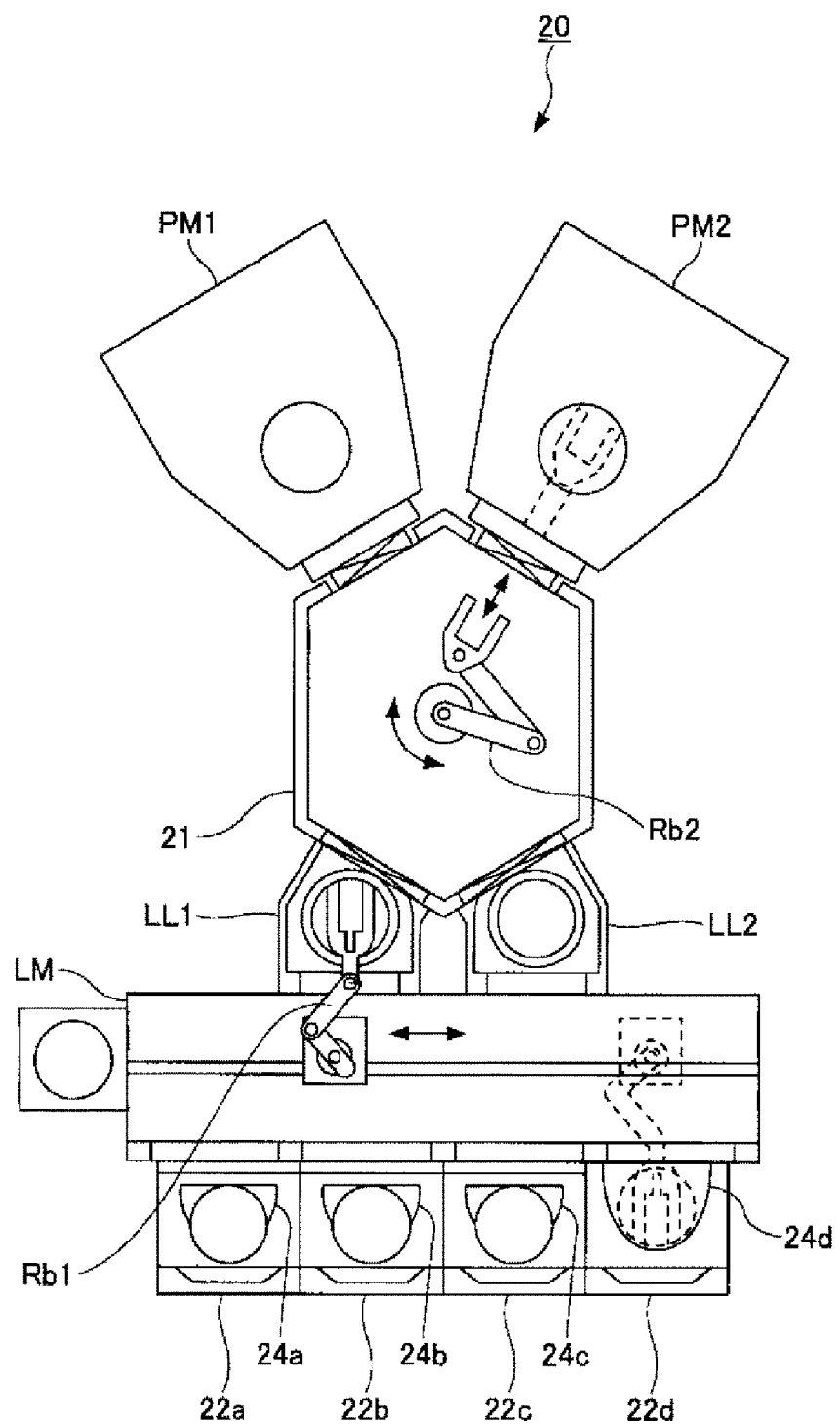
FIG. 14 is a schematic diagram of a substrate processing system in accordance with the example embodiment.

The MRAM device 100 is manufactured by using, for example, a substrate processing system as depicted in FIG. 14. A substrate processing system 20 includes load ports 22a to 22d, FOUPs 24a to 24d, a loader module LM, load-lock chambers LL1 and LL2, process modules PM1 and PM2, and a transfer chamber 21.

The load ports 22a to 22d are arranged along a periphery of the loader module LM. On the load ports 22a to 22d, the FOUPs 24a to 24d are mounted respectively. Within the FOUPs 24a to 24d, target substrates W are accommodated at multiple levels.

Within the loader module LM, a transfer robot Rb1 is provided. The transfer robot Rb1 is configured to take out the target substrate W accommodated in any one of the FOUPs 24a to 24d and configured to transfer the target substrate W to the load-lock chamber LL1 or LL2.

The load-lock chambers LL1 and LL2 are connected to the loader module LM via gate valves. Further, the load-lock chambers LL1 and LL2 are connected to the transfer chamber 21 via gate valves. The load-lock chambers LL1 and LL2 are configured to transfer the target substrates W between the loader module LM disposed at atmosphere state and the transfer chamber 21 disposed at vacuum state.

The transfer chamber 21 is a depressurizable chamber, and a transfer robot Rb2 is provided within the transfer chamber 21. The transfer chamber 21 is connected to the process modules PM1 and PM2 via gate valves. The transfer robot Rb2 is configured to take out the unprocessed target substrate W from the load-lock chamber LL1 or LL2, and then, transfer the unprocessed target substrate W to the process module PM1 or PM2. Further the transfer robot Rb2 is configured to take out the processed target substrate W from the process module PM1 or PM2, and then, transfer the processed target substrate W to the load-lock chamber LL1 or LL2.

The process module PM1 is an example of an etching apparatus (see FIG. 15: substrate processing apparatus) configured to perform an etching process and a treatment process in an example. The process module PM2 is an example of a film forming apparatus (forming, for example, a metal stacked film or a protective film). As the film forming apparatus, a CVD (Chemical Vapor Deposition) apparatus or a RLSA (Radial Line Slot Antenna) apparatus may be used.

Hereinafter, a schematic configuration of the process module PM1 configured to perform an etching process and a treatment process will be explained with reference to FIG. 15.

[Etching Apparatus/Process Module PM1]

Figure 15:
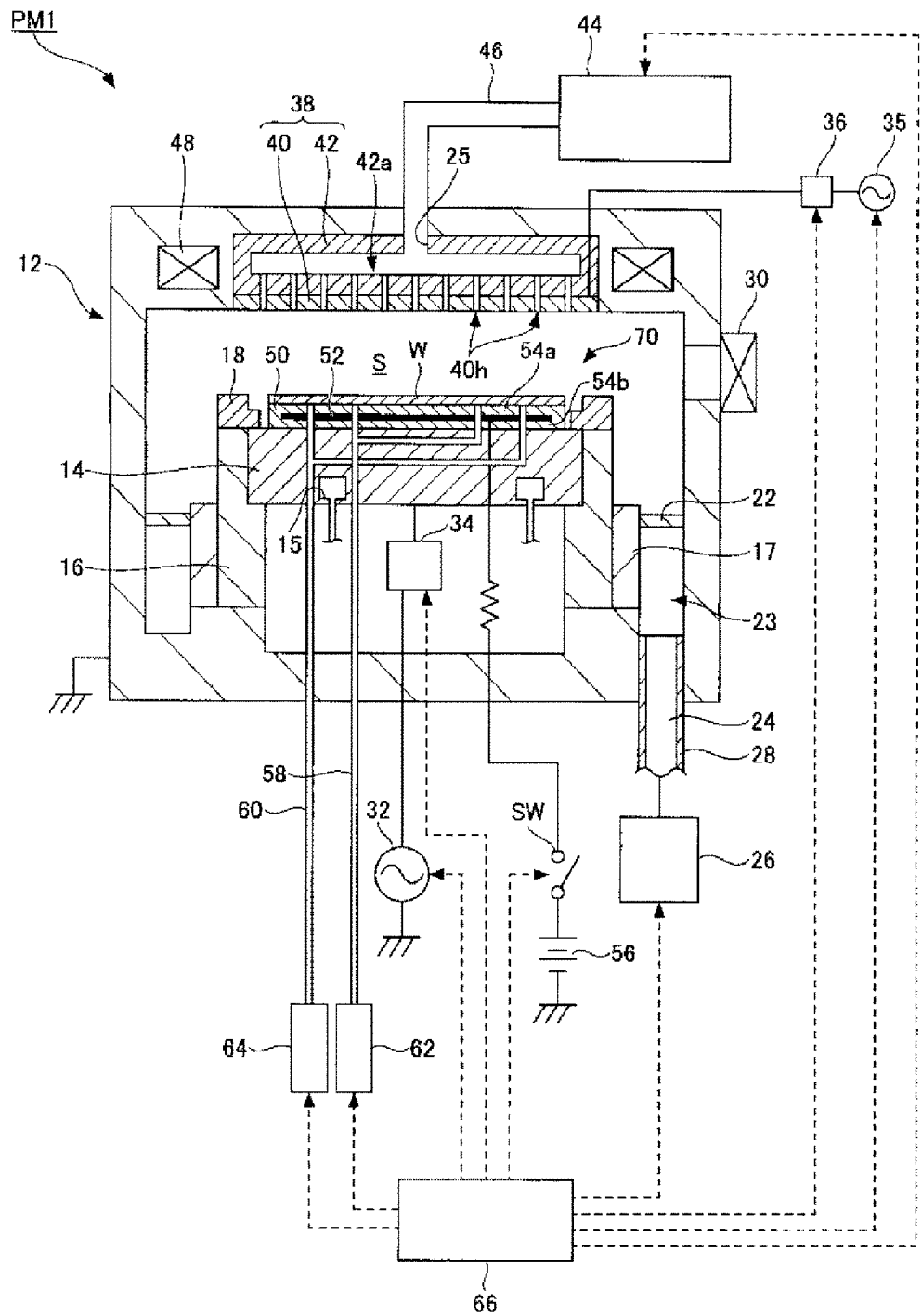
FIG. 15 is a longitudinal cross sectional view of a process module PM1 (etching apparatus) in accordance with the example embodiment.

FIG. 15 illustrates the process module PM1 configured to perform an etching process and a treatment process in accordance with the example embodiment. The process module PM1 as an etching apparatus includes the processing chamber 12. The processing chamber 12 has a substantially cylindrical shape and forms a processing space S as an inner space thereof. The processing chamber 12 includes a substantially circular plate-shaped susceptor 14 within the processing chamber 12. The susceptor 14 is provided at a lower space of the processing space S. The susceptor 14 is made of, for example, aluminum and constitutes a lower electrode. The susceptor 14 is configured to cool an electrostatic chuck 50 to be described later by absorbing heat from the electrostatic chuck 50.

Within the susceptor 14, a coolant path 15 is formed, and the coolant path 15 is connected to a coolant inlet line and a coolant outlet line. By appropriately circulating a coolant such as cooling water through the coolant path 15, the susceptor 14 and the electrostatic chuck 50 are controlled to have a preset temperature.

The process module PM1 further includes a cylindrical holder 16 and a cylindrical supporting unit 17. The cylindrical holder 16 is in contact with the periphery of a side surface and a bottom surface of the susceptor 14 to hold the susceptor 14. The cylindrical supporting unit 17 is vertically extended from a bottom portion of the processing chamber 12 and is configured to support the susceptor 14 via the cylindrical holder 16. The process module PM1 further includes a focus ring 18 mounted on a top surface of the cylindrical holder 16. The focus ring 18 may be made of, for example, silicon or quartz.

Between a side wall of the processing chamber 12 and the cylindrical supporting unit 17, an exhaust path 23 is formed. A baffle plate 22 is provided at an inlet or at the middle of the exhaust path 23. Further, an exhaust opening 24 is formed at a bottom portion of the exhaust path 23. An exhaust pipe 28 is inserted and fitted into a bottom portion of the processing chamber 12 to form the exhaust opening 24. The exhaust pipe 28 is connected to an exhaust device 26. The exhaust device 26 includes a vacuum pump and can depressurize the processing space S within the processing chamber 12 to a certain vacuum level. At a side wall of the processing chamber 12, a gate valve 30 configured to open and close a loading/unloading opening of the target substrate W is provided.

The susceptor 14 is connected to a second high frequency power supply 32 for plasma generation via a matching unit 34. The second high frequency power supply 32 is configured to apply a high frequency power having a second frequency (for example, about 400 kHz) to the lower electrode, i.e., the susceptor 14.

The process module PM1 includes a shower head 38 at a ceiling portion thereof. The shower head 38 is provided at an upper space of the processing space S. The shower head 38 includes an electrode plate 40 and an electrode supporting member 42 and serves as an upper electrode.

The electrode plate 40 is a conductive plate having a substantially circular plate shape and is connected to a first high frequency power supply 35 for plasma generation via a matching unit 36. The first high frequency power supply 35 is configured to apply a high frequency power having a first frequency (for example, about 60 MHz) to the electrode plate 40. If high frequency powers are applied to the susceptor 14 and the electrode plate 40 from the second high frequency power supply 32 and the first high frequency power supply 35, respectively, a high frequency electric field is formed at a space, i.e., the processing space S, between the susceptor 14 and the electrode plate 40.

Multiple gas through holes 40h are formed in the electrode plate 40. The electrode plate 40 is detachably attached and supported on the electrode supporting member 42 and can be replaced. Within the electrode supporting member 42, a buffer room 42a is formed. A gas inlet opening 25 of the buffer room 42a is connected to a gas supply source 44 via a gas supply line 46. The gas supply source 44 is configured to supply a processing gas into the processing space S. By way of example, the gas supply source 44 can supply a $CO_2$ gas and a $CH_4$ gas during an etching process and a $CF_4$ gas during a treatment process. Multiple openings are formed in the electrode supporting member 42, and respectively connected to the multiple gas through holes 40h. Further, the multiple openings communicate with the buffer room 42a. Therefore, a gas supplied from the gas supply source 44 is supplied into the processing chamber S through the gas supply line 46, the buffer room 42a, and the gas through holes 40h. Further, a flow rate of the processing gas at a central portion of the target substrate W and a flow rate of the processing gas at a peripheral portion of the target substrate W may be controlled.

At a ceiling of the processing chamber 12, there is provided a magnetic field forming unit 48 that is extended annularly or concentrically. The magnetic field forming unit 48 is configured to facilitate the start of the high frequency electric discharge (plasma ignition) in the processing space S and stably maintain the electric discharge.

The electrostatic chuck 50 is mounted on a top surface of the susceptor 14. The electrostatic chuck 50 includes an electrode 52 and a pair of the insulating films 54a and 54b. The electrode 52 is a conductive film and provided between the insulating films 54a and 54b. The insulating films 54a and 54b are made of an insulating material such as ceramic. The electrode 52 is connected to a DC power supply 56 via a switch SW. If a DC voltage is applied to the electrode 52 from the DC power supply 56, a Coulomb force is generated and the target substrate W is attracted and held onto the electrostatic chuck 50 by the Coulomb force. Within the electrostatic chuck 50, a heater (not illustrated) as a heating member is embedded and configured to heat the target substrate W to a certain temperature. The heater is connected to a heater power supply (not illustrated) via a wiring. The susceptor 14 and the electrostatic chuck 50 constitute a mounting table 70.

The process module PM1 includes heat transfer gas supplying lines 58 and 60 and heat transfer gas supplying sources 62 and 64. The heat transfer gas supplying source 62 is connected to the heat transfer gas supplying line 58. The heat transfer gas supplying line 58 is extended to a top surface of the electrostatic chuck 50 and extended annularly at a central portion of the top surface thereof. The heat transfer gas supplying source 62 is configured to supply a heat transfer gas such as a He gas between the top surface of the electrostatic chuck 50 and the target substrate W. Further, the heat transfer gas supplying source 64 is connected to the heat transfer gas supplying line 60. The heat transfer gas supplying line 60 is extended to the top surface of the electrostatic chuck 50 and extended annularly at the top surface thereof to surround the heat transfer gas supplying line 58. The heat transfer gas supplying source 64 is configured to supply a heat transfer gas such as a He gas between the top surface of the electrostatic chuck 50 and the target substrate W.

The process module PM1 further includes a control unit 66. The control unit 66 is connected to the exhaust device 26, the switch SW, the second high frequency power supply 32, the matching unit 34, the first high frequency power supply 35, the matching unit 36, the gas supply source 44, and the heat transfer gas supplying sources 62 and 64. The control unit 66 transmits a control signal to each of the exhaust device 26, the switch SW, the second high frequency power supply 32, the matching unit 34, the first high frequency power supply 35, the matching unit 36, the gas supply source 44, and the heat transfer gas supplying sources 62 and 64. In response to the control signal from the control unit 66, exhaust by the exhaust device 26, ON/OFF of the switch SW, power supply from the second and first high frequency power supplies 32 and 35, impedance control of the matching units 34 and 36, processing gas supply by the gas supply source 44, and heat transfer gas supply by each of the heat transfer gas supplying sources 62 and 64 are controlled.

In the process module PM1, an etching process and a treatment process are performed while mounting a multilayered film including a metal stacked film in which an insulating layer is interposed between a first magnetic layer and a second magnetic layer on the mounting table 70. During the etching process, a gas containing at least C, O, and H is supplied from the gas supply source 44 to the processing space S. The supplied gas is excited into plasma through ionization and dissociation by the high frequency electric field. During the etching process, the metal stacked film is etched with radicals or ions of the generated plasma.

During the treatment process, a gas containing at least $CF_4$ gas is supplied. The gas is excited into plasma through ionization and dissociation by the high frequency electric field. During the treatment process, the reaction product Z generated during the etching process is removed by the generated plasma. A schematic configuration of the process module PM1 configured to perform the etching process and the treatment process has been explained above.

As explained above, a good etching process can be performed by optimizing a gas for the etching process and the treatment process of a metal stacked film in which an insulating layer is interposed between two layers of magnetic materials.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. An etching method of etching a multilayered film including a metal stacked film in which an insulating layer is interposed between a first magnetic layer and a second magnetic layer, the etching method comprising:
    etching the metal stacked film with plasma generated by supplying a gas mixture containing at least a $CO_2$ gas and a $CH_4$ gas into a processing chamber; and
    treating the metal stacked film with plasma generated by supplying a gas containing at least a $CF_4$ gas into the processing chamber to remove, from the metal stacked film, a reaction product which is deposited when the metal stacked film is etched by using the $CO_2$ gas and the $CH_4$ gas.

2. The etching method of claim 1,
wherein the etching method is used for a manufacturing process of a MRAM device as the multilayered film including the metal stacked film.

3. A substrate processing apparatus comprising:
a processing chamber;
a gas supply source configured to supply a gas into the processing chamber;
a mounting table configured to mount thereon a multilayered film including a metal stacked film in which an insulating layer is interposed between a first magnetic layer and a second magnetic layer;
a high frequency power supply configured to supply a high frequency power into the processing chamber; and
a control unit configured to control a process for the multilayered film,
wherein the control unit controls an etching process of etching the metal stacked film with plasma generated from a gas mixture containing at least a $CO_2$ gas and a $CH_4$ gas into the processing chamber by using the high frequency power supplied into the processing chamber; and a treating process of treating the metal stacked film with plasma generated from a gas containing at least a $CF_4$ gas supplied into the processing chamber to remove, from the metal stacked film, a reaction product which is deposited when the metal stacked film is etched by using the $CO_2$ gas and the $CH_4$ gas by using the high frequency power supplied into the processing chamber.

4. The substrate processing apparatus of claim 3,
wherein the high frequency power supply supplies a high frequency bias power of about 1000 W or more into the processing chamber.

5. The etching method of claim 1,
wherein the treating of the metal stacked film is performed after the etching of the metal stacked film.

6. The etching method of claim 1,
wherein the treating of the metal stacked film is performed during the etching of the metal stacked film.

7. The etching method of claim 1,
wherein the etching of the metal stacked film and the treating of the metal stacked film are alternately repeated a predetermined number of times.

* * * * *